United States Patent
Pandya et al.

(10) Patent No.: US 10,989,758 B2
(45) Date of Patent: Apr. 27, 2021

(54) SYSTEM AND METHOD FOR TEMPORAL SIGNAL MEASUREMENT OF DEVICE UNDER TEST (DUT) AND METHOD OF FORMING SYSTEM

(71) Applicant: AEM Singapore Pte. Ltd., Singapore (SG)

(72) Inventors: Harshang Nileshkumar Pandya, Singapore (SG); Xing Zhu, Singapore (SG); Arvindbhai Chimanbhai Patel, Singapore (SG); Minglei Cui, Singapore (SG)

(73) Assignee: AEM SINGAPORE PTE. LTD., Singapore (SG)

( * ) Notice: Subject to any disclaimer, the term of this patent is extended or adjusted under 35 U.S.C. 154(b) by 54 days.

(21) Appl. No.: 16/575,592

(22) Filed: Sep. 19, 2019

(65) Prior Publication Data

US 2020/0096568 A1 Mar. 26, 2020

(30) Foreign Application Priority Data

Sep. 21, 2018 (SG) .............................. 10201808233T (51) Int. Cl.
*G01R 31/28* (2006.01)
*G01R 31/319* (2006.01)
*H03L 7/197* (2006.01)

(52) U.S. Cl.
CPC ... *G01R 31/31908* (2013.01); *G01R 31/2851* (2013.01); *G01R 31/31907* (2013.01); *H03L 7/197* (2013.01)

(58) Field of Classification Search
None
See application file for complete search history.

(56) References Cited

U.S. PATENT DOCUMENTS 5,289,116 A 2/1994 Kurita
5,589,763 A 12/1996 Burns
(Continued)

FOREIGN PATENT DOCUMENTS

EP 1437855 7/2004

OTHER PUBLICATIONS

Understanding Eye Pattern Measurements. Anritsu Company. p. 1-20. Mar. 2010. Available at: https://rintintin.colorado.edu/~gifford/5830-AWL/Anritsu%20Eye%20Diagram.pdf.
(Continued)

*Primary Examiner* — Guerrier Merant
(74) *Attorney, Agent, or Firm* — Carlson, Gaskey & Olds, P.C.

(57) ABSTRACT

A measurement system of a device under test (DUT) includes a reference clock synthesizer configured to generate a master reference clock signal, a transmitter unit connected to the reference clock synthesizer and configured to connect to the DUT, and a measurement control system connected to the transmitter unit and configured to control the transmitter unit to generate a test signal pattern based on a first reference clock signal derived from the master reference clock signal, and generate a signal for passing through the DUT based on the test signal pattern. A receiver unit connected to the reference clock synthesizer is configured to connect to the DUT and to detect the signal and generate a digital signal based on the signal and a second reference clock signal derived from the master reference clock signal. The measurement control system is configured to provide an output signal based on the digital signal.

20 Claims, 5 Drawing Sheets

(56) References Cited

U.S. PATENT DOCUMENTS

| | | |
|---|---|---|
| 5,774,242 A | 6/1998 | O'Sullivan et al. |
| 8,841,923 B1 | 9/2014 | Vanwiggeren |
| 2018/0174626 A1 | 6/2018 | Hsu |

OTHER PUBLICATIONS

EP Extended Search Report for EP Application No. 19198326.1 dated Feb. 26, 2020.

SYSTEM AND METHOD FOR TEMPORAL SIGNAL MEASUREMENT OF DEVICE UNDER TEST (DUT) AND METHOD OF FORMING SYSTEM

CROSS-REFERENCE TO RELATED APPLICATION

This application claims the benefit of priority of Singapore patent application No. 10201808233T filed on 21 Sep. 2018, the contents of it being hereby incorporated by reference in its entirety for all purposes.

TECHNICAL FIELD

Various aspects of this disclosure relate to a measurement system for temporal signal measurement of a device under test (DUT). Various aspects of this disclosure relate to a method of forming a measurement system for temporal signal measurement of a device under test (DUT). Various aspects of this disclosure relate to a method of measuring temporal signal of a device under test (DUT).

BACKGROUND

As the speed of transmission keeps increasing, it is important to characterize passive communications channels such as a cable to ensure that the distortion caused to the signal due to the channel transmission parameters is within acceptable limit. Typically, bit error ratio (BER) measurement or eye-diagram measurement is used for this assessment. However, BER measurement is time-consuming, whereas eye-diagram measurement can be intuitive and fast, and so it is a widely adopted measurement method. Currently available test setups for eye-diagram measurement employ a plurality of measurement equipment connected for performing the eye-diagram measurement.

SUMMARY

Various embodiments may provide a measurement system for temporal signal measurement of a device under test (DUT). The measurement system may include a reference clock synthesizer configured to generate a master reference clock signal. The measurement system may include a transmitter unit connected to the reference clock synthesizer and configured to connect to a first end of the device under test (DUT). The measurement system may include a measurement control system connected to the transmitter unit, the measurement control system configured to control the transmitter unit to generate a test signal pattern based on a first reference clock signal derived from the master reference clock signal, and to generate a signal for passing through the device under test (DUT) based on the test signal pattern. The measurement system may include a receiver unit connected to the reference clock synthesizer and configured to connect to a second end of the device under test (DUT), and the receiver unit configured to detect the signal that passes through the device under test (DUT) and further configured to generate a digital signal based on the signal detected and a second reference clock signal derived from the master reference clock signal. In various embodiments, the measurement control system may be connected to the receiver unit, wherein the measurement control system may be further configured to provide an output signal including measurement results based on the digital signal.

Various embodiments may provide a method of forming a measurement system for temporal signal measurement of a device under test (DUT). The method may include connecting a reference clock synthesizer to a transmitter unit and to a receiver unit. The method may include connecting a measurement control system to the transmitter unit and to the receiver unit. In various embodiments, the transmitter unit may be configured to connect to a first end of the device under test (DUT) and the receiver unit may be configured to connect to a second end of the device under test (DUT). In various embodiments, the reference clock synthesizer may be configured to generate a master reference clock signal and the measurement control system may be configured to control the transmitter unit to generate a test signal pattern based on a first reference clock signal derived from the master reference clock signal, and to generate a signal for passing through the device under test (DUT) based on the test signal pattern. In various embodiments, the receiver unit may be configured to detect the signal that passes through the device under test (DUT) and may be configured to generate a digital signal based on the signal detected and a second reference clock signal derived from the master reference clock signal. In various embodiments, the measurement control system may be further configured to provide an output signal including measurement results based on the digital signal.

Various embodiments may provide a method of measuring temporal signal of a device under test (DUT). The method may include generating a master reference clock signal using a reference clock synthesizer. The method may include using a measurement control system connected to a transmitter unit to control the transmitter unit to generate a test signal pattern based on a first reference clock signal derived from the master reference clock signal, and to generate a signal for passing through the device under test (DUT) based on the test signal pattern, wherein the transmitter unit connected to the reference clock synthesizer and connected to a first end of the device under test (DUT). The method may include detecting the signal that passes through the device under test (DUT) and generating a digital signal based on the signal detected and a second reference clock signal derived from the master reference clock signal, using a detector unit connected to the measurement control system, the reference clock synthesizer and to a second end of the device under test (DUT). The method may include providing an output signal including measurement results based on the digital signal using the measurement control system.

BRIEF DESCRIPTION OF THE DRAWINGS

The invention will be better understood with reference to the detailed description when considered in conjunction with the non-limiting examples and the accompanying drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described below in the context of the system are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any system, device, or structure or any part of any system, device or structure.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

As used herein, the term "and/or" includes any and all combinations of one or more of the associated listed items.

Various embodiments may provide a measurement system for temporal signal measurement of a device under test (DUT).

Figure 1:
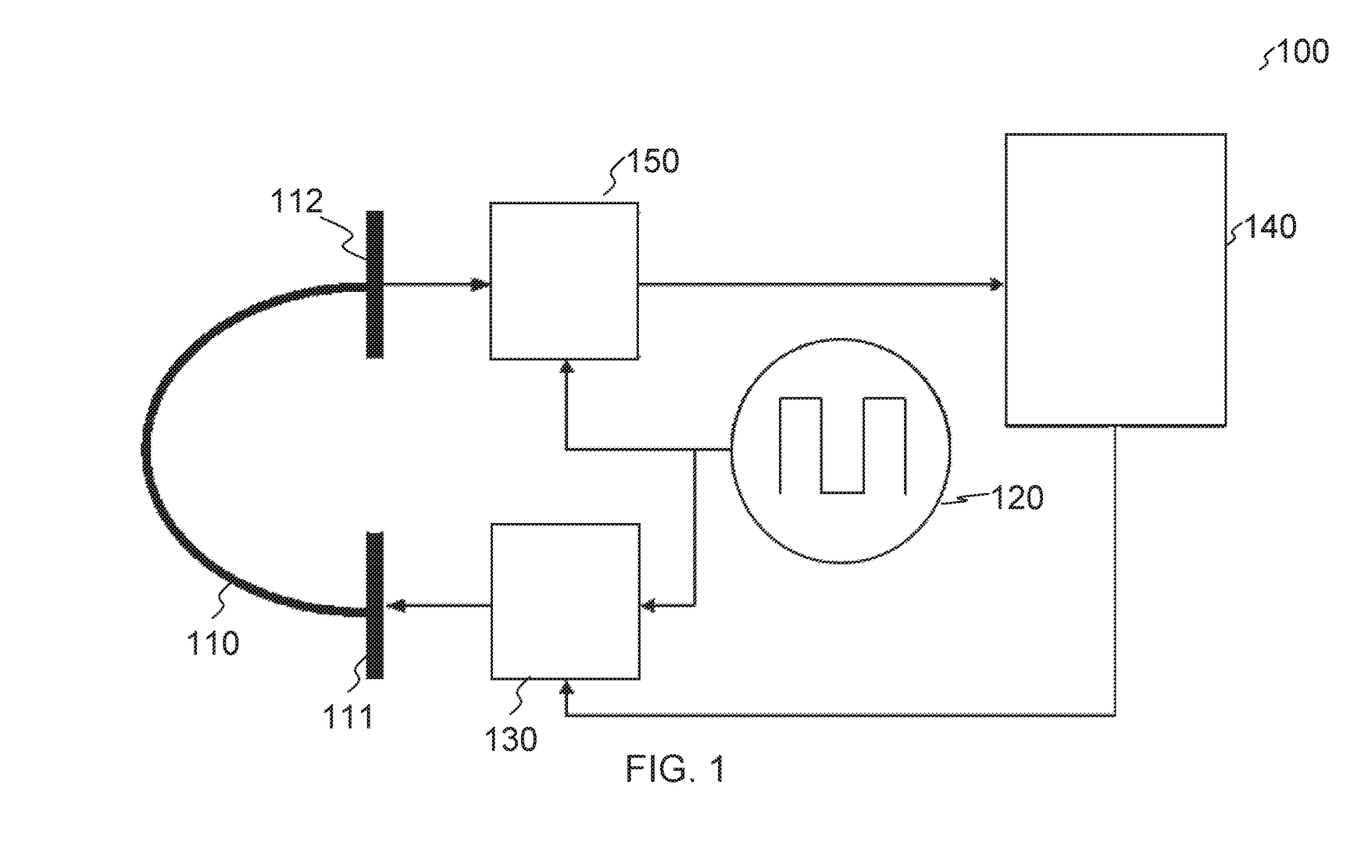
FIG. 1 is an illustration of a measurement system for temporal signal measurement of a device under test (DUT) according to various embodiments.

FIG. 1 is an illustration of a measurement system 100 for temporal signal measurement of a device under test (DUT) 110 according to various embodiments.

In various embodiments, the measurement system 100 may include a reference clock synthesizer 120 configured to generate a master reference clock signal. The measurement system 100 may include a transmitter unit 130 connected to the reference clock synthesizer 120 and configured to connect to a first end 111 of the device under test (DUT) 110. The measurement system may include a measurement control system 140 connected to the transmitter unit 130, the measurement control system 140 configured to control the transmitter unit 130 to generate a test signal pattern based on a first reference clock signal derived from the master reference clock signal, and to generate a signal for passing through the device under test (DUT) 110 based on the test signal pattern.

In various embodiments, reference clock synthesizer 120 may be capable of providing a plurality of reference clock signals. In various embodiments, the master reference clock signal may be generated at a specified frequency. In various embodiments, the first reference clock signal may be generated at a specified frequency.

In various embodiments, the test signal pattern may be predetermined. In various embodiments, the test signal pattern may be a pseudo random binary sequence (PRBS). In various embodiments, the test signal pattern may be a square wave sequence. The type of the test signal pattern is not limited thereto, suitable the test signal pattern may be used.

In various embodiments, the transmitter unit 130 may be an optical transmitter unit. In various embodiments, the signal for passing through the device under test (DUT) 110 may be an optical signal.

In various embodiments, the first reference clock signal may be an integer or fractional multiple of the master reference clock signal. In various embodiments, the master clock signal and the first reference clock signal may be synchronized. In various embodiments, the first reference clock signal and the master reference clock signal may be phase-locked.

In various embodiments, the measurement system may include a receiver unit 150 connected to the reference clock synthesizer 120 and configured to connect to a second end 112 of the device under test (DUT) 110, and the receiver unit 150 configured to detect the signal that passes through the device under test (DUT) 110 and further configured to generate a digital signal based on the signal detected and a second reference clock signal derived from the master reference clock signal. In various embodiments, the measurement control system 140 may be connected to the receiver unit 150.

In various embodiments, the receiver unit 150 may be an optical receiver unit. In various embodiments, the signal that passes through the device under test (DUT) 110 may be an optical signal.

In various embodiments, the second reference clock signal may be an integer or fractional multiple of the master reference clock signal. In various embodiments, the master clock signal and the second reference clock signal may be synchronized. In various embodiments, the second reference clock signal and the master reference clock signal may be phase-locked.

In various embodiments, the measurement control system 140 may be further configured to provide an output signal including measurement results based on the digital signal.

In various embodiments, the measurement result may be an eye-diagram measurement. In various embodiments, the measurement result may be in any suitable form.

In various embodiments, the measurement control system 140 may provide the measurement result to an external device. The external device may be a display monitor or a computer or a storage device. The type of device is not limited thereto, suitable device may be used. In various embodiments, the measurement control system 140 may provide the measurement result to an inbuilt display device or computer.

In various embodiments, the measurement control system 140 may be connected to a device via a standard communication interface such as an Ethernet cable or by any other suitable means.

In various embodiments, the device under test (DUT) 110 may be a cable. The cable may be a copper cable or an optical fiber cable. The optical fiber cable may be a multi-fiber cable. The type of cable is not limited thereto, any suitable cable may be used.

In various embodiments, the device under test (DUT) 110 may be a semiconductor device or a printed circuit board (PCB). The type of device is not limited thereto, any suitable device may be used.

In various embodiments, the measurement system 100 for temporal signal measurement of a device under test (DUT) 110 may be a single test equipment. In various embodiments, in the single test equipment, the transmitter unit 130 and receiver unit 150 may use a common clock source.

In various embodiments, a period of a test signal may be spanned by 1,000 samples of sampling frequency.

In various embodiments, the signal for passing through the device under test (DUT) 110 based on the test signal pattern may be generated by the transmitter unit 130 at test frequency $f\_t$.

In various embodiments, the signal that passes through the device under test (DUT) 110 may be sampled by the receiver unit 150 at a sampling frequency of $f\_s$. The samples may be digitized to produce digitized received test pattern. In various embodiments, the sampling frequency $f\_s$ may be a fraction of the test frequency $f\_t$ such that some specific number N of consecutive samples may span a full waveform of the test signal.

In various embodiments, the measurement control system 140 may collect the digitized received test pattern. The measurement control system 140 may provide an output signal including measurement results. The measurement control system 140 may present the digitized received test pattern in the form of an eye diagram.

The table below shows an example of possible clock ratios of the test frequency $f\_t$, the sampling frequency $f\_s$ and a fractional ratio of the test frequency $f\_t$ and the sampling frequency $f\_s$.

| Test frequency $f\_t$ | fractional ratio | Sampling frequency $f\_s$ |
|---|---|---|
| 12,800 MHz | $f\_s = 1000/(20,001) f\_t$ | 639.96800159992 MHz |

Figure 2:
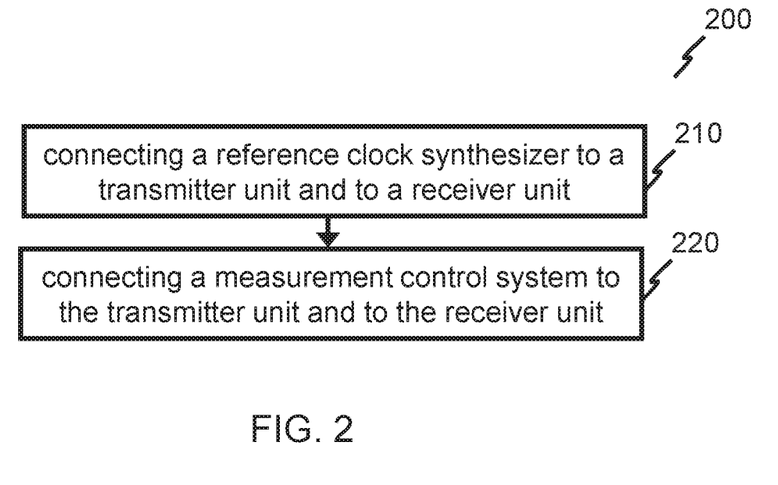
FIG. 2 shows a flowchart of a method of forming a measurement system for temporal signal measurement of a device under test (DUT) according to various embodiments.

FIG. 2 shows a flowchart of a method 200 of forming a measurement system 100 for temporal signal measurement of a device under test (DUT) 110 according to various embodiments.

In various embodiments, a first step 210 of the method 200 may include connecting a reference clock synthesizer 120 to a transmitter unit 130 and to a receiver unit 150.

In various embodiments, a second step 220 of the method 200 may include connecting a measurement control system 140 to the transmitter unit 130 and to the receiver unit 150.

In various embodiments, the transmitter unit 130 may be configured to connect to a first end 111 of the device under test (DUT) 110 and the receiver unit 150 may be configured to connect to a second end 112 of the device under test (DUT) 110.

In various embodiments, the reference clock synthesizer 120 may be configured to generate a master reference clock signal and the measurement control system 140 may be configured to control the transmitter unit 130 to generate a test signal pattern based on a first reference clock signal derived from the master reference clock signal, and may generate a signal for passing through the device under test (DUT) 110 based on the test signal pattern.

In various embodiments, reference clock synthesizer 120 may be capable of providing a plurality of reference clock signals. In various embodiments, the master reference clock signal may be generated at a specified frequency. In various embodiments, the first reference clock signal may be generated at a specified frequency.

In various embodiments, the test signal pattern may be predetermined. In various embodiments, the test signal pattern may be a pseudo random binary sequence (PRBS). In various embodiments, the test signal pattern may be a square wave sequence. The type of the test signal pattern is not limited thereto, suitable the test signal pattern may be used.

In various embodiments, the transmitter unit 130 may be an optical transmitter unit. In various embodiments, the signal for passing through the device under test (DUT) 110 may be an optical signal.

In various embodiments, the first reference clock signal may be an integer or fractional multiple of the master reference clock signal. In various embodiments, the master clock signal and the first reference clock signal may be synchronized. In various embodiments, the first reference clock signal and the master reference clock signal may be phase-locked.

In various embodiments, the receiver unit 150 may be configured to detect the signal that passes through the device under test (DUT) 110 and may be configured to generate a digital signal based on the signal detected and a second reference clock signal derived from the master reference clock signal. In various embodiments, the measurement control system 140 may be connected to the receiver unit 150.

In various embodiments, the receiver unit 150 may be an optical receiver unit. In various embodiments, the signal that passes through the device under test (DUT) 110 may be an optical signal.

In various embodiments, the second reference clock signal may be an integer or fractional multiple of the master reference clock signal. In various embodiments, the master clock signal and the second reference clock signal may be synchronized. In various embodiments, the second reference clock signal and the master reference clock signal may be phase-locked.

In various embodiments, the measurement control system 140 may be further configured to provide an output signal including measurement results based on the digital signal.

In various embodiments, the measurement result may be an eye-diagram measurement. In various embodiments, the measurement result may be in any suitable form.

In various embodiments, the measurement control system 140 may provide the measurement result to an external device. The external device may be a display monitor or a computer or a storage device. The type of device is not limited thereto, suitable device may be used. In various embodiments, the measurement control system 140 may provide the measurement result to an inbuilt display device or computer.

In various embodiments, the measurement control system 140 may be connected to a device via a standard communication interface such as an Ethernet cable or by any other suitable means.

In various embodiments, the device under test (DUT) 110 may be a cable. The cable may be a copper cable or an optical fiber cable. The optical fiber cable may be a multi-fiber cable. The type of cable is not limited thereto, any suitable cable may be used.

In various embodiments, the device under test (DUT) 110 may be a semiconductor device or a printed circuit board (PCB). The type of device is not limited thereto, any suitable device may be used.

In various embodiments, the measurement system 100 for temporal signal measurement of a device under test (DUT) 110 may be formed as a single test equipment. In various embodiments, in the single test equipment, the transmitter unit 130 and receiver unit 150 may use a common clock source.

In various embodiments, the order of the steps of the method 200 is not limited thereto, any suitable order may be used. Various embodiments may also include methods related to any components included in the transmitter unit 130 and/or the receiver unit 150.

Figure 3:
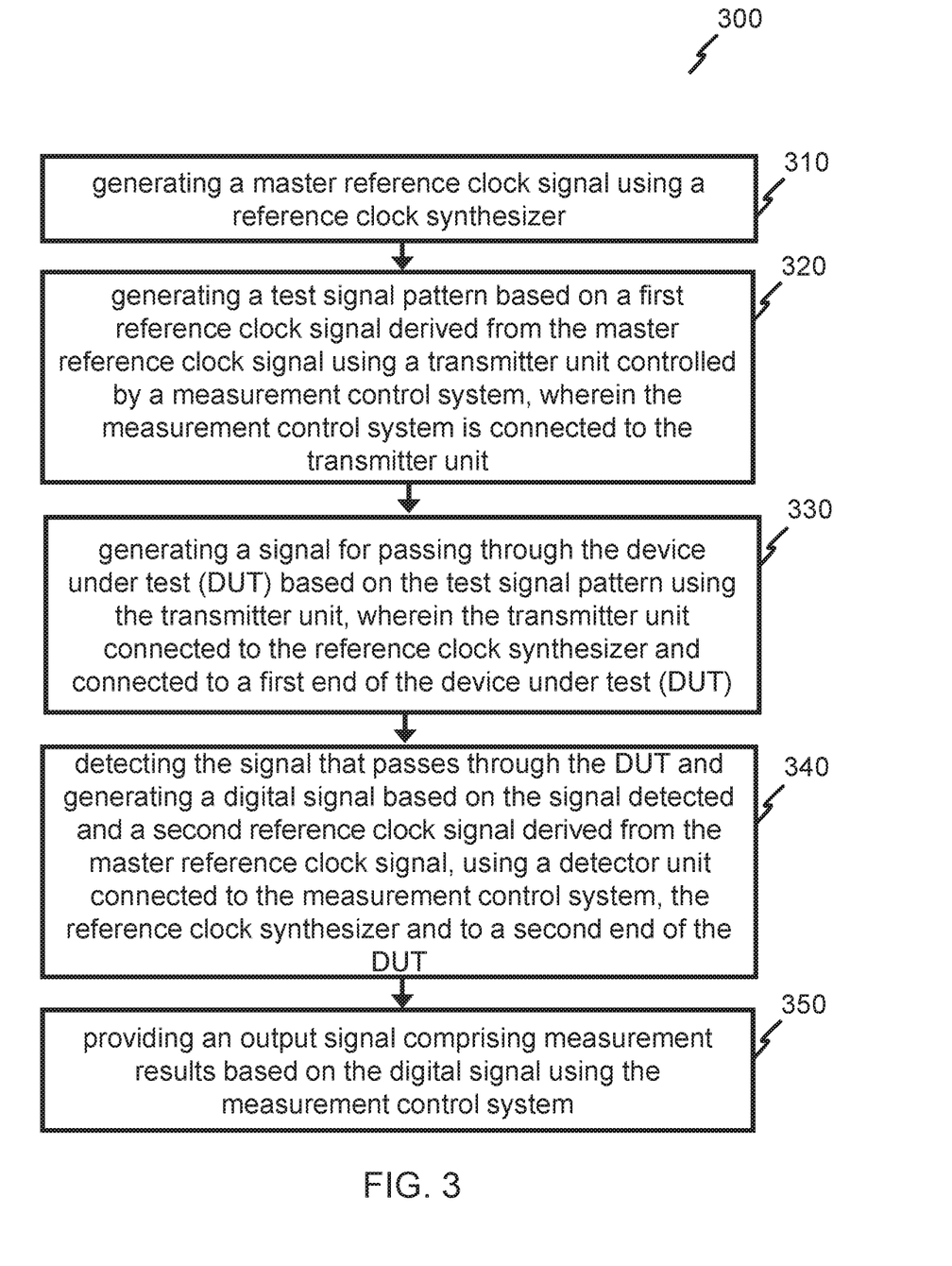
FIG. 3 shows a flowchart of a method of measuring temporal signal of a device under test (DUT) according to various embodiments.

FIG. 3 shows a flowchart of a method 300 of measuring temporal signal of a device under test (DUT) 110 according to various embodiments.

In various embodiments, the method 300 may include a first step 310 of generating a master reference clock signal using a reference clock synthesizer 120.

In various embodiments, the method 300 may include a second step 320 of generating a test signal pattern based on a first reference clock signal derived from the master reference clock signal using a transmitter unit controlled by a measurement control system, wherein the measurement control system may be connected to the transmitter unit.

In various embodiments, the method 300 may include a third step 330 of generating a signal for passing through the device under test (DUT) based on the test signal pattern using the transmitter unit, wherein the transmitter unit may be connected to the reference clock synthesizer and may be connected to a first end of the device under test (DUT).

In various embodiments, reference clock synthesizer 120 may be capable of providing a plurality of reference clock signals. In various embodiments, the master reference clock signal may be generated at a specified frequency. In various embodiments, the first reference clock signal may be generated at a specified frequency.

In various embodiments, the test signal pattern may be predetermined. In various embodiments, the test signal pattern may be a pseudo random binary sequence (PRBS). In various embodiments, the test signal pattern may be a square wave sequence. The type of the test signal pattern is not limited thereto, suitable the test signal pattern may be used.

In various embodiments, the transmitter unit 130 may be an optical transmitter unit. In various embodiments, the signal for passing through the device under test (DUT) 110 may be an optical signal.

In various embodiments, the first reference clock signal may be an integer or fractional multiple of the master reference clock signal. In various embodiments, the master clock signal and the first reference clock signal may be synchronized. In various embodiments, the first reference clock signal and the master reference clock signal may be phase-locked.

In various embodiments, the method 300 may include a fourth step 340 of detecting the signal that passes through the device under test (DUT) 110 and may include generating a digital signal based on the signal detected and a second reference clock signal derived from the master reference clock signal, using the receiver unit 150 connected to the measurement control system 140, the reference clock synthesizer 120 and to a second end 112 of the device under test (DUT) 110.

In various embodiments, the receiver unit 150 may be an optical receiver unit. In various embodiments, the signal that passes through the device under test (DUT) 110 may be an optical signal.

In various embodiments, the second reference clock signal may be an integer or fractional multiple of the master reference clock signal. In various embodiments, the master clock signal and the second reference clock signal may be synchronized. In various embodiments, the second reference clock signal and the master reference clock signal may be phase-locked.

In various embodiments, the method 300 may include a fifth step 350 of providing an output signal including measurement results based on the digital signal using the measurement control system 140.

In various embodiments, the measurement result may be an eye-diagram measurement. In various embodiments, the measurement result may be in any suitable form.

In various embodiments, the measurement control system 140 may provide the measurement result to an external device. The external device may be a display monitor or a computer or a storage device. The type of device is not limited thereto, suitable device may be used. In various embodiments, the measurement control system 140 may provide the measurement result to an inbuilt display device or computer.

In various embodiments, the measurement control system 140 may be connected to a device via a standard communication interface such as an Ethernet cable or by any other suitable means.

In various embodiments, the device under test (DUT) 110 may be a cable. The cable may be a copper cable or an optical fiber cable. The optical fiber cable may be a multi-fiber cable. The type of cable is not limited thereto, any suitable cable may be used.

In various embodiments, the device under test (DUT) 110 may be a semiconductor device or a printed circuit board (PCB). The type of device is not limited thereto, any suitable device may be used.

In various embodiments, the measurement system 100 for temporal signal measurement of a device under test (DUT) 110 may be formed as a single test equipment. In various embodiments, in the single test equipment, the transmitter unit 130 and receiver unit 150 may use a common clock source.

In various embodiments, the order of the steps in method 300 is not limited thereto, any suitable order may be used.

Figure 4:
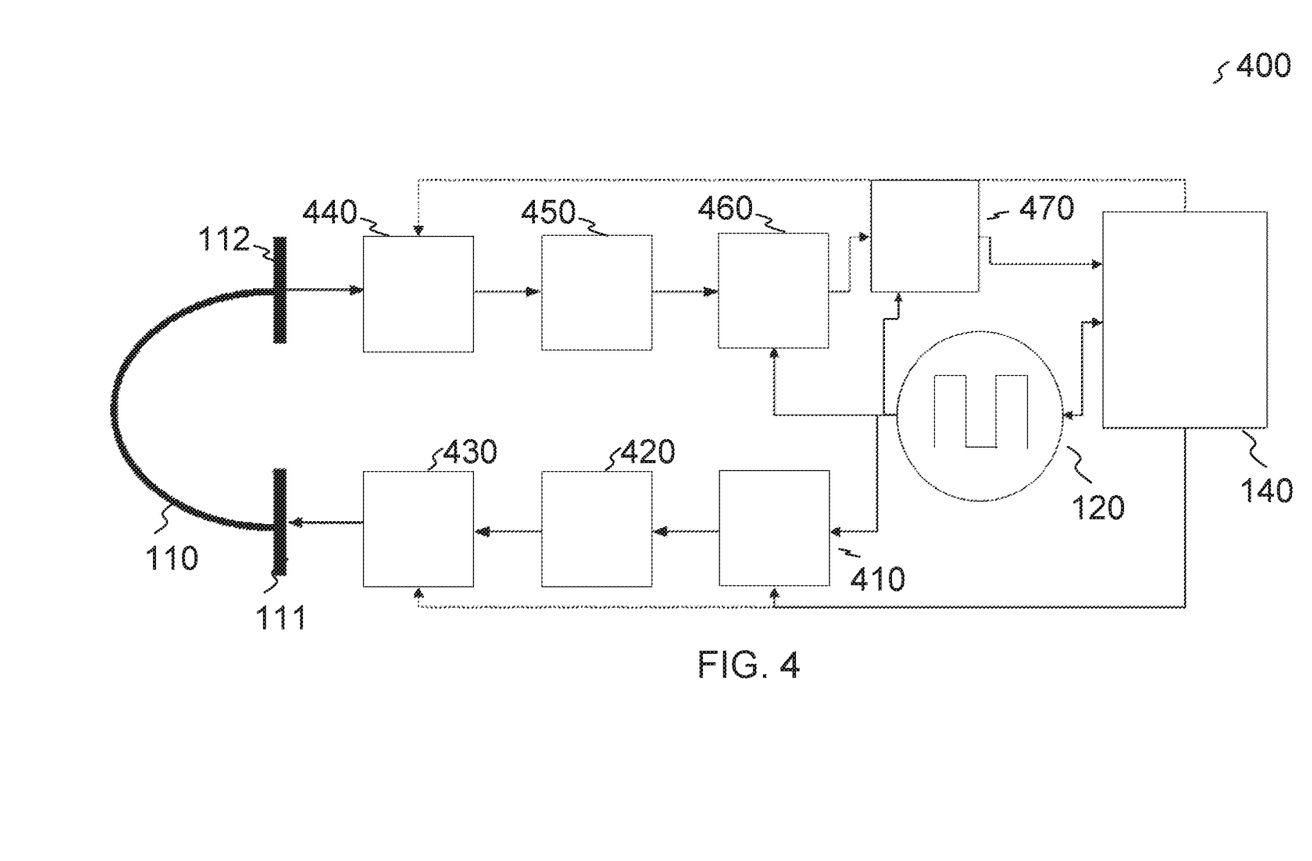
FIG. 4 is an illustration of a measurement system for temporal signal measurement of a device under test (DUT) according to various embodiments.

FIG. 4 is an illustration of a measurement system 400 for temporal signal measurement of a device under test (DUT) 110 according to various embodiments.

In various embodiments, a measurement system 400 may include a reference clock synthesizer 120, a transmitter unit 130, a measurement control system 140 and a receiver unit 150.

In various embodiments, the transmitter unit 130 may include a signal generator 410 and/or a transmitter module 420 and/or a first switch 430.

In various embodiments, the receiver unit 150 may include a detector module 450 and/or a track and hold device 460 and/or a response signal digitizer 470 and/or a second switch 430.

In various embodiments, transmitter unit 130 may be connected to the reference clock synthesizer 120 and may be configured to connect to a first end 111 of a device under test (DUT) 110. In various embodiments, the measurement control system 140 may be connected to the transmitter unit 130. In various embodiments, the receiver unit 150 may be connected to the reference clock synthesizer 120 and may be configured to connect to a second end 112 of the device under test (DUT) 110. In various embodiments, the reference clock synthesizer 120 may be connected to the measurement control system 140.

In various embodiments, the transmitter unit 130 may include a signal generator 410 connected to the reference clock synthesizer 120. In various embodiments, the signal generator 410 may be configured to receive the first reference clock signal. The signal generator 410 may be configured to generate the test signal pattern based on the first reference clock signal derived from the master reference clock signal. In various embodiments, the signal generator 410 may be a radio frequency (RF) signal generator. In various embodiments, the signal generator 410 generates a predetermined test pattern clocked by a multiple of the first reference clock signal.

In various embodiments, reference clock synthesizer 120 may be capable of providing a plurality of reference clock signals. In various embodiments, the master reference clock signal may be generated at a specified frequency. In various embodiments, the first reference clock signal may be generated at a specified frequency.

In various embodiments, the test signal pattern may be predetermined. In various embodiments, the test signal pattern may be a pseudo random binary sequence (PRBS). In various embodiments, the test signal pattern may be a square wave sequence. The type of the test signal pattern is not limited thereto, suitable the test signal pattern may be used.

In various embodiments, the signal generator 410 may be connected to the measurement control system 140.

In various embodiments, the transmitter unit 130 may include a transmitter module 420 connected to the signal generator 410, the transmitter module 420 may be configured to generate the signal for passing through the device under test (DUT) 110 based on the test signal pattern.

In various embodiments, the transmitter module 420 may be an optical transmitter module. In various embodiments, the signal for passing through the device under test (DUT) 110 may be an optical signal.

In various embodiments, the transmitter module 420 may be connected to the reference clock synthesizer 120 and the measurement control system 140. In various embodiments, the transmitter module 420 may perform the function of the signal generator 410.

In various embodiments, the first reference clock signal may be an integer or fractional multiple of the master reference clock signal. In various embodiments, the master clock signal and the first reference clock signal may be synchronized. In various embodiments, the first reference clock signal and the master reference clock signal may be phase-locked.

In various embodiments, the receiver unit 150 may include a detector module 450 which may be configured to detect the signal that passes through the device under test (DUT) 110 and may be configured to generate a response signal based on the signal detected.

In various embodiments, the signal that passes through the device under test (DUT) 110 may be an optical signal. The detector module 450 may be an optical detector module. The detector module 450 may receive the optical signal from the device under test (DUT) 110 and may convert it to an electrical signal. In various embodiments, the detector module 450 may be configured to connect to a second end 112 of the device under test (DUT) 110.

In various embodiments, the receiver unit 150 may include a track and hold device 460 connected to the detector module 450 and the reference clock synthesizer 120, the track and hold device 460 may be configured to generate a sampled response signal based on the response signal and based on a third reference clock signal derived from the master reference clock signal. In various embodiments, the track and hold device 460 may be capable of tracking the response signal and holding the response signal when a clock edge is received, the output of the track and hold device 460 being the sampled response signal. The track and hold device 460 may sample the response signal at the edge of a third reference clock signal. The frequency of the third reference clock signal may be derived using sub-sampling based scheme such that a response to a complete predetermined test pattern may be sampled over a plurality of cycles of the predetermined test pattern.

In various embodiments, the holding of the response signal is not limited to the clock edge, the track and hold device 460 may track the response signal and hold the response signal at any suitable period.

In various embodiments, the third reference clock signal may be an integer or fractional multiple of the master reference clock signal. In various embodiments, the master clock signal and the third reference clock signal may be synchronized. In various embodiments, the third reference clock signal and the master reference clock signal may be phase-locked.

In various embodiments, the track and hold device 460 may be configured to connect to a second end 112 of the device under test (DUT) 110. In various embodiments, the track and hold device 460 may perform the function of the detector module 450.

In various embodiments, the receiver unit 150 may include a response signal digitizer 470 connected to the track and hold device 460 and the reference clock synthesizer 120, the response signal digitizer 470 may be configured to generate the digital signal based on the sampled response signal and the second reference clock signal derived from the master reference clock signal.

In various embodiments, the second reference clock signal may be an integer or fractional multiple of the master reference clock signal. In various embodiments, the master clock signal and the second reference clock signal may be synchronized. In various embodiments, the second reference clock signal and the master reference clock signal may be phase-locked.

In various embodiments, the measurement control system may be connected to the reference clock synthesizer 120 and the response signal digitizer 470. In various embodiments, the measurement control system may be configured to provide the output signal including the measurement results based on the digital signal generated by the response signal digitizer 470, and a fourth reference clock signal derived from the master reference clock signal.

In various embodiments, the fourth reference clock signal may be an integer or fractional multiple of the master reference clock signal. In various embodiments, the master clock signal and the fourth reference clock signal may be synchronized. In various embodiments, the fourth reference clock signal and the master reference clock signal may be phase-locked.

In various embodiments, the measurement result may be an eye-diagram measurement. In various embodiments, the measurement result may be in any suitable form.

In various embodiments, the measurement control system 140 may provide the measurement result to an external device. The external device may be a display monitor or a computer or a storage device. The type of device is not limited thereto, suitable device may be used. In various embodiments, the measurement control system 140 may provide the measurement result to an inbuilt display device or computer.

In various embodiments, the measurement control system 140 may be connected to a device via a standard communication interface such as an Ethernet cable or by any other suitable means.

In various embodiments, the device under test (DUT) 110 may be a cable. The cable may be a copper cable or an optical fiber cable. The optical fiber cable may be a multi-fiber cable. The type of cable is not limited thereto, any suitable cable may be used.

In various embodiments, the device under test (DUT) 110 may be a semiconductor device or a printed circuit board (PCB). The type of device is not limited thereto, any suitable device may be used.

In various embodiments, the measurement system 400 for temporal signal measurement of a device under test (DUT) 110 may be a single test equipment. In various embodiments, in the single test equipment, the transmitter unit 130 and receiver unit 150 may use a common clock source.

In various embodiments, the first reference clock signal, the second reference clock signal, the third reference clock signal, and the fourth reference clock signal may be an integer or fractional multiple of the master reference clock signal. In various embodiments, the first reference clock signal, the second reference clock signal, the third reference clock signal, and the fourth reference clock signal may be synchronized. In various embodiments, the first reference clock signal, the second reference clock signal, the third reference clock signal, and the fourth reference clock signal may be phase-locked.

In various embodiments, the transmitter unit 130 may include a first switch 430 and the signal generated by the transmitter unit 130 for passing through the device under test (DUT) 110 may pass to the device under test (DUT) 110 via the first switch 430. In various embodiments, the receiver unit 150 may include a second switch 440 and the signal may pass through the device under test (DUT) 110 to the receiver unit 150 via the second switch 440.

In various embodiments, the first switch 430 may be connected to transmitter module 430. In various embodiments, the second switch 440 may be connected to the detector module 450.

In various embodiments, the first switch 430 may be outside transmitter unit 130. In various embodiments, the second switch 440 may be outside receiver unit 150.

In various embodiments, the device under test (DUT) 110 is a multi-fiber cable. The multi-fiber cable may include a plurality of fiber cords. The first switch 430 may be configured to pass the signal from the transmitter unit 130 to one of the plurality of fiber cords, and the second switch 440 may be configured to receive the signal from the one of the plurality of fiber cords.

In various embodiments, the measurement control system 140 may control which fiber cord of the plurality of fiber cords is used to pass the signal.

In various embodiments, the measurement control system 140 may sequence through each fiber cord of the plurality of fiber cords and may perform measurement by appropriately configuring the first switch 430 and the second switch 440.

In various embodiments, the transmitter module 420 may be an optical transmitter module 420 and may accept the predetermined test signal pattern and convert it to an optical predetermined test signal and further transmits the optical predetermined test signal to the first transmitter fiber cord.

In various embodiments, the first switch 430 may connect a first transmitter fiber cord of the plurality of fiber cords at an input to one of the plurality of fiber cables at an output.

In various embodiments, the output fiber is selected by an control input from the measurement control system 140.

Figure 5:
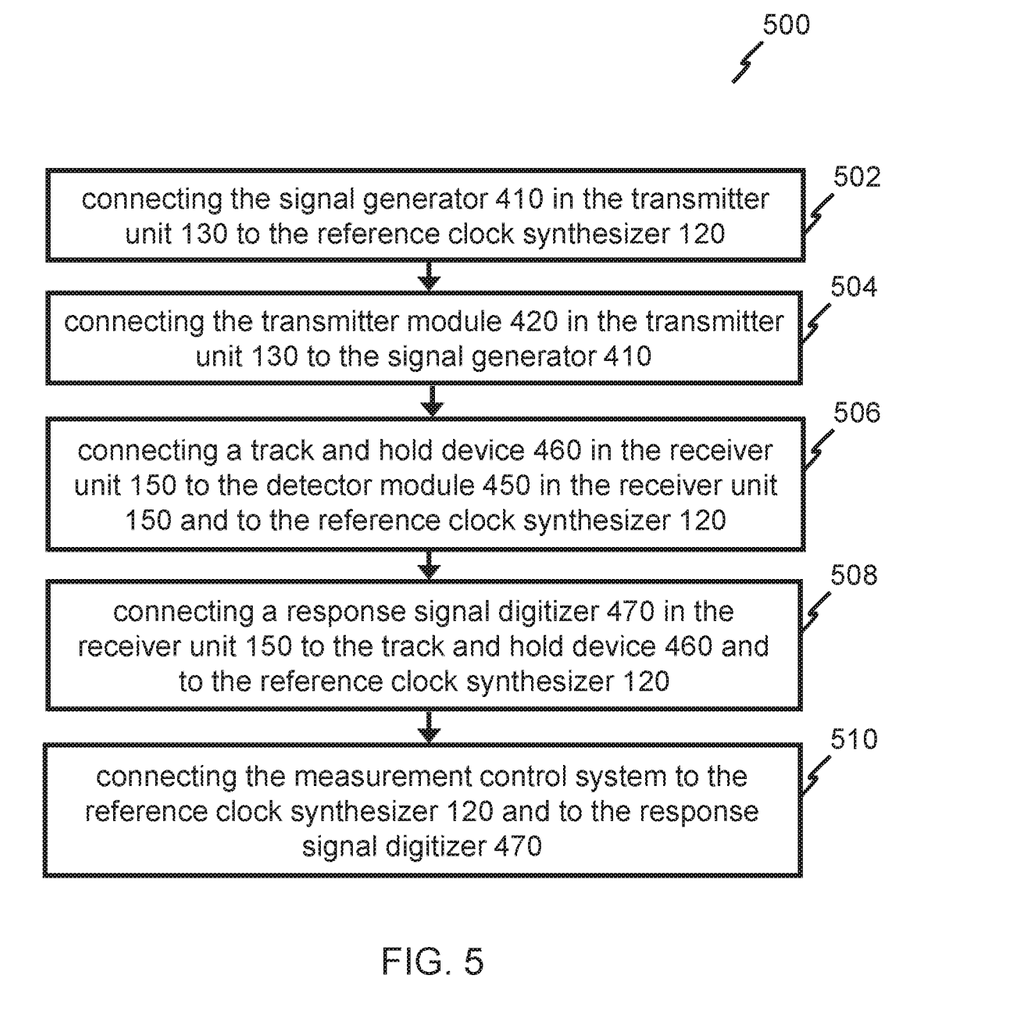
FIG. 5 shows a flowchart of a method of forming a measurement system for temporal signal measurement of a device under test (DUT) according to various embodiments.

FIG. 5 shows a flowchart of a method 500 of forming a measurement system 400 for temporal signal measurement of a device under test (DUT) 110 according to various embodiments.

In various embodiments, the method may include a first step 502 of connecting the signal generator 410 in the transmitter unit 130 to the reference clock synthesizer 120. The signal generator 410 may be configured to generate the test signal pattern based on the first reference clock signal derived from the master reference clock signal. In various embodiments, the signal generator 410 may be a radio frequency (RF) signal generator. In various embodiments, the signal generator 410 generates a predetermined test pattern clocked by a multiple of the first reference clock signal.

In various embodiments, reference clock synthesizer 120 may be capable of providing a plurality of reference clock signals. In various embodiments, the master reference clock signal may be generated at a specified frequency. In various embodiments, the first reference clock signal may be generated at a specified frequency.

In various embodiments, the test signal pattern may be predetermined. In various embodiments, the test signal pattern may be a pseudo random binary sequence (PRBS). In various embodiments, the test signal pattern may be a square wave sequence. The type of the test signal pattern is not limited thereto, suitable the test signal pattern may be used.

In various embodiments, the method may include a second step 504 of connecting the transmitter module 420 in the transmitter unit 130 to the signal generator 410. The transmitter module 420 may be configured to generate the signal for passing through the device under test (DUT) 110 based on the test signal pattern.

In various embodiments, the transmitter module 420 may be an optical transmitter module. In various embodiments, the signal for passing through the device under test (DUT) 110 may be an optical signal.

In various embodiments, the transmitter module 420 may be connected to the reference clock synthesizer 120 and the measurement control system 140. In various embodiments, the transmitter module 420 may perform the function of the signal generator 410.

In various embodiments, the first reference clock signal may be an integer or fractional multiple of the master reference clock signal. In various embodiments, the master clock signal and the first reference clock signal may be synchronized. In various embodiments, the first reference clock signal and the master reference clock signal may be phase-locked.

In various embodiments, the receiver unit 150 may include a detector module 450. The detector module 450 may be configured to detect the signal that passes through the device under test (DUT) 110 and may generate a response signal based on the signal detected.

In various embodiments, the signal that passes through the device under test (DUT) 110 may be an optical signal. The detector module 450 may be an optical detector module. The detector module 450 may receive the optical signal from the device under test (DUT) 110 and may convert it to an electrical signal. In various embodiments, the detector module 450 may be configured to connect to a second end 112 of the device under test (DUT) 110.

In various embodiments, the method may include a third step 506 connecting a track and hold device 460 in the receiver unit 150 to the detector module 450 in the receiver unit 150 and to the reference clock synthesizer 120. The track and hold device 460 may be configured to receive the response signal from the detector module 450. The track and hold device 460 may be configured to generate a sampled response signal based on the response signal and based on a third reference clock signal derived from the master reference clock signal.

The track and hold device 460 may sample the response signal at the edge of a third reference clock signal. The frequency of the third reference clock signal may be derived using sub-sampling based scheme such that a response to a complete predetermined test pattern may be sampled over a plurality of cycles of the predetermined test pattern.

In various embodiments, the holding of the response signal is not limited to the clock edge, the track and hold device 460 may track the response signal and hold the response signal at any suitable period.

In various embodiments, the third reference clock signal may be an integer or fractional multiple of the master reference clock signal. In various embodiments, the master clock signal and the third reference clock signal may be synchronized. In various embodiments, the third reference clock signal and the master reference clock signal may be phase-locked.

In various embodiments, the method may include a fourth step 508 of connecting a response signal digitizer 470 in the receiver unit 150 to the track and hold device 460 and to the reference clock synthesizer 120. The response signal digitizer 470 may be configured to generate the digital signal based on the sampled response signal and the second reference clock signal derived from the master reference clock signal.

In various embodiments, the second reference clock signal may be an integer or fractional multiple of the master reference clock signal. In various embodiments, the master clock signal and the second reference clock signal may be synchronized. In various embodiments, the second reference clock signal and the master reference clock signal may be phase-locked.

In various embodiments, the method may include a fifth step 510 of connecting the measurement control system to the reference clock synthesizer 120 and to the response signal digitizer 470. The measurement control system may be configured to provide the output signal including the measurement results based on the digital signal and a fourth reference clock signal derived from the master reference clock signal.

In various embodiments, the fourth reference clock signal may be an integer or fractional multiple of the master reference clock signal. In various embodiments, the master clock signal and the fourth reference clock signal may be synchronized. In various embodiments, the fourth reference clock signal and the master reference clock signal may be phase-locked.

In various embodiments, the measurement result may be an eye-diagram measurement. In various embodiments, the measurement result may be in any suitable form.

In various embodiments, the measurement control system 140 may provide the measurement result to an external device. The external device may be a display monitor or a computer or a storage device. The type of device is not limited thereto, suitable device may be used. In various embodiments, the measurement control system 140 may provide the measurement result to an inbuilt display device or computer.

In various embodiments, the measurement control system 140 may be connected to a device via a standard communication interface such as an Ethernet cable or by any other suitable means.

In various embodiments, the device under test (DUT) 110 may be a cable. The cable may be a copper cable or an optical fiber cable. The optical fiber cable may be a multi-fiber cable. The type of cable is not limited thereto, any suitable cable may be used.

In various embodiments, the device under test (DUT) 110 may be a semiconductor device or a printed circuit board (PCB). The type of device is not limited thereto, any suitable device may be used.

In various embodiments, the measurement system 400 for temporal signal measurement of a device under test (DUT) 110 may be a single test equipment. In various embodiments, in the single test equipment, the transmitter unit 130 and receiver unit 150 may use a common clock source.

In various embodiments, the first reference clock signal, the second reference clock signal, the third reference clock signal, and the fourth reference clock signal may be an integer or fractional multiple of the master reference clock signal. In various embodiments, the first reference clock signal, the second reference clock signal, the third reference clock signal, and the fourth reference clock signal may be synchronized. In various embodiments, the first reference clock signal, the second reference clock signal, the third reference clock signal, and the fourth reference clock signal may be phase-locked.

In various embodiments, the transmitter unit 130 may include a first switch 430.

In various embodiments, the receiver unit 150 may include a second switch 440.

In various embodiments, the first switch 430 may be configured to pass the signal for passing through the device under test (DUT) 110 from the transmitter unit 130 to the device under test (DUT) 110. In various embodiments, the second switch 440 may be configured to pass the signal for passing through the device under test (DUT) 110 from the device under test (DUT) 110 to the receiver unit 150.

In various embodiments, the first switch 430 may be connected to transmitter module 430. In various embodiments, the second switch 440 may be connected to the detector module 450.

In various embodiments, the first switch 430 may be outside transmitter unit 130. In various embodiments, the second switch 440 may be outside receiver unit 150.

In various embodiments, the device under test (DUT) 110 may be a multi-fiber cable. The multi-fiber cable may include a plurality of fiber cords. In various embodiments, the signal may be passed from the transmitter unit 130 to one of the plurality of fiber cords using the first switch 430. In various embodiments, the signal may be received by the receiver unit 150 from the one of the plurality of fiber cords using the second switch 440.

The order of the steps of method 500 is not limited thereto, any suitable order of steps may be used. Also, some steps of method 500 may be omitted.

A system and method of implementing eye-diagram and other temporal signal quality measurement on the device under test ("DUT") by using a single test equipment with transmit and receive sections using a common clock source may be provided. The temporal response measurement system provided may be suitable for high-speed communications channels.

While the invention has been particularly shown and described with reference to specific embodiments, it should be understood by those skilled in the art that various changes in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. A measurement system for temporal signal measurement of a device under test (DUT), the measurement system comprising:
   a reference clock synthesizer configured to generate a master reference clock signal;
   a transmitter unit connected to the reference clock synthesizer and configured to connect to a first end of the device under test (DUT);
   a measurement control system connected to the transmitter unit, the measurement control system configured to control the transmitter unit to generate a test signal pattern based on a first reference clock signal derived from the master reference clock signal, and to generate a signal for passing through the device under test (DUT) based on the test signal pattern; and
   a receiver unit connected to the reference clock synthesizer and configured to connect to a second end of the device under test (DUT), and the receiver unit configured to detect the signal that passes through the device under test (DUT) and further configured to generate a digital signal based on the signal detected and a second reference clock signal derived from the master reference clock signal;
   wherein the measurement control system is connected to the receiver unit; and
   wherein the measurement control system is further configured to provide an output signal comprising measurement results based on the digital signal.

2. The measurement system according to claim 1, wherein the transmitter unit comprises a signal generator connected to the reference clock synthesizer, the signal generator configured to generate the test signal pattern based on the first reference clock signal derived from the master reference clock signal.

3. The measurement system according to claim 2, wherein the transmitter unit comprises a transmitter module connected to the signal generator, the transmitter module configured to generate the signal for passing through the device under test (DUT) based on the test signal pattern.

4. The measurement system according to claim 1, wherein the receiver unit comprises a detector module configured to detect the signal that passes through the device under test (DUT) and configured to generate a response signal based on the signal detected.

5. The measurement system according to claim 4, wherein the receiver unit comprises a track and hold device connected to the detector module and the reference clock synthesizer, the track and hold device configured to generate a sampled response signal based on the response signal and based on a third reference clock signal derived from the master reference clock signal.

6. The measurement system according to claim 5, wherein the receiver unit comprises a response signal digitizer connected to the track and hold device and the reference clock synthesizer, the response signal digitizer configured to generate the digital signal based on the sampled response signal and the second reference clock signal derived from the master reference clock signal.

7. The measurement system according to claim 6, wherein the measurement control system is connected to the reference clock synthesizer and the response signal digitizer, the measurement control system configured to provide the output signal comprising the measurement results based on the digital signal generated by the response signal digitizer, and a fourth reference clock signal derived from the master reference clock signal.

8. The measurement system according to claim 7, wherein the first reference clock signal, the second reference clock signal, the third reference clock signal, and the fourth reference clock signal are synchronized.

9. The measurement system according to claim 1,
   wherein the transmitter unit comprises a first switch and the signal generated by the transmitter unit for passing through the device under test (DUT) passes to the device under test (DUT) via the first switch; and
   wherein the receiver unit comprises a second switch and the signal passes through the device under test (DUT) to the receiver unit via the second switch.

10. The measurement system according to claim 9,
    wherein the device under test (DUT) is a multi-fiber cable comprising a plurality of fiber cords; and
    wherein the first switch is configured to pass the signal from the transmitter unit to one of the plurality of fiber cords, and the second switch is configured to receive the signal from the one of the plurality of fiber cords.

11. A method of forming a measurement system for temporal signal measurement of a device under test (DUT), the method comprising steps of:
    connecting a reference clock synthesizer to a transmitter unit and to a receiver unit;
    connecting a measurement control system to the transmitter unit and to the receiver unit;
    wherein the transmitter unit is configured to connect to a first end of the device under test (DUT) and the receiver unit is configured to connect to a second end of the device under test (DUT);
    wherein the reference clock synthesizer is configured to generate a master reference clock signal and the measurement control system is configured to control the transmitter unit to generate a test signal pattern based on a first reference clock signal derived from the master reference clock signal, and to generate a signal for passing through the device under test (DUT) based on the test signal pattern;
    wherein the receiver unit is configured to detect the signal that passes through the device under test (DUT) and is configured to generate a digital signal based on the signal detected and a second reference clock signal derived from the master reference clock signal; and
    wherein the measurement control system is further configured to provide an output signal comprising measurement results based on the digital signal.

12. The method according to claim 11, further comprising the step of:
    connecting a signal generator in the transmitter unit to the reference clock synthesizer;
    wherein the signal generator is configured to generate the test signal pattern based on the first reference clock signal derived from the master reference clock signal.

13. The method according to claim 12, further comprising the step of:

connecting a transmitter module in the transmitter unit to the signal generator;

wherein the transmitter module is configured to generate the signal for passing through the device under test (DUT) based on the test signal pattern.

14. The method according to claim 11, wherein the receiver unit comprises a detector module; and wherein the detector module is configured to detect the signal that passes through the device under test (DUT) and to generate a response signal based on the signal detected.

15. The method according to claim 14, further comprising the steps of:

connecting a track and hold device in the receiver unit to the detector module in the receiver unit and to the reference clock synthesizer;

wherein the track and hold device is configured to generate a sampled response signal based on the response signal and based on a third reference clock signal derived from the master reference clock signal.

16. The method according to claim 15, further comprising the step of:

connecting a response signal digitizer in the receiver unit to the track and hold device and to the reference clock synthesizer;

wherein the response signal digitizer is configured to generate the digital signal based on the sampled response signal and the second reference clock signal derived from the master reference clock signal.

17. The method according to claim 16, further comprising the step of:

connecting the measurement control system to the reference clock synthesizer and to the response signal digitizer;

wherein the measurement control system is configured to provide the output signal comprising the measurement results based on the digital signal and a fourth reference clock signal derived from the master reference clock signal.

18. The method according to claim 11, wherein the transmitter unit comprises a first switch;

wherein the receiver unit comprises a second switch;

wherein the first switch is configured to pass the signal for passing through the device under test (DUT) from the transmitter unit to the device under test (DUT); and wherein the second switch is configured to pass the signal for passing through the device under test (DUT) from the device under test (DUT) to the receiver unit.

19. The method according to claim 18, wherein the device under test (DUT) is a multi-fiber cable comprising a plurality of fiber cords;

wherein the signal is passed from the transmitter unit to one of the plurality of fiber cords using the first switch; and wherein the signal is received by the receiver unit from the one of the plurality of fiber cords using the second switch.

20. A method of measuring temporal signal of a device under test (DUT), the method comprising steps of:

generating a master reference clock signal using a reference clock synthesizer;

generating a test signal pattern based on a first reference clock signal derived from the master reference clock signal using a transmitter unit controlled by a measurement control system, wherein the measurement control system is connected to the transmitter unit;

generating a signal for passing through the device under test (DUT) based on the test signal pattern using the transmitter unit, wherein the transmitter unit connected to the reference clock synthesizer and connected to a first end of the device under test (DUT);

detecting the signal that passes through the device under test (DUT) and generating a digital signal based on the signal detected and a second reference clock signal derived from the master reference clock signal, using a detector unit connected to the measurement control system, the reference clock synthesizer and to a second end of the device under test (DUT);

providing an output signal comprising measurement results based on the digital signal using the measurement control system.

* * * * *